United States Patent [19]
Uejima et al.

[11] Patent Number: 5,751,748
[45] Date of Patent: May 12, 1998

[54] SYSTEM FOR MONITORING AMOUNT OF LIGHT EMITTED FROM SURFACE EMITTING LASER

[75] Inventors: Atsushi Uejima; Yoshiharu Okino; Yoshinori Morimoto; Toshiyuki Inoue; Kenichi Kodama, all of Kanagawa-ken, Japan

[73] Assignee: Fuji Photo Film Co., Ltd., Kanagawa, Japan

[21] Appl. No.: 658,084

[22] Filed: Jun. 4, 1996

[30] Foreign Application Priority Data

Jun. 5, 1995 [JP] Japan .................. 7-138181

[51] Int. Cl.$^6$ .................................................. H01S 3/10
[52] U.S. Cl. ........................... 372/31; 372/36; 372/109
[58] Field of Search ............................. 372/31, 29, 36, 372/109

[56] References Cited

U.S. PATENT DOCUMENTS 5,604,757  2/1997  Liang et al. .................. 372/29

FOREIGN PATENT DOCUMENTS 3-24783  2/1991  Japan .................. 372/31

Primary Examiner—James W. Davie
Attorney, Agent, or Firm—Sughrue, Mion, Zinn, Macpeak & Seas, PLLC

[57] ABSTRACT

A system for monitoring the amount of light emitted from a surface emitting laser includes a beam splitter which is fixed to the surface emitting laser and splits a part of a laser beam emitted from the laser as a monitor light, and a photodetector which detects the monitor light.

9 Claims, 10 Drawing Sheets

SYSTEM FOR MONITORING AMOUNT OF LIGHT EMITTED FROM SURFACE EMITTING LASER

BACKGROUND OF THE INVENTION

1. Field of the Invention

This invention relates to a monitoring system for monitoring the amount of light emitted from a surface emitting laser.

2. Description of the Related Art

There has been known a surface emitting laser which emits a laser beam in perpendicular direction to the active layer. Such a surface emitting laser is advantageous over an edge emitting semiconductor laser in that the angle of divergence of the emitted laser is substantially uniform in every direction in a cross-section of the beam and it is easy to form a laser array, and accordingly, there have been made various attempts of applying a surface emitting laser in various fields.

A semiconductor laser is generally driven under an automatic power control and accordingly it is necessary to monitor the amount of light emitted from the semiconductor laser. However since the surface emitting laser does not emit light rearward unlike the edge emitting semiconductor laser, the amount of light emitted therefrom cannot be monitored on the basis of the rearward emitted light.

In the case of the edge emitting laser, the amount of light emitted therefrom may be monitored by splitting a part of the forward emitted light by a beam splitter inserted into an optical system through which the forward emitted light travels and using the split part of the forward emitted light as a monitoring light. Such an arrangement of the light amount monitor may be applied to the surface emitting laser.

However, when a beam splitter is inserted into such an optical system, especially when a plurality of laser beams are used, the number of parts in the optical system increases, which adds to the size of the system in which the lasers are employed, and at the same time, positioning of the optical parts is complicated, which adds to the cost of the system.

When the surface emitting lasers are used as a laser array, a plurality of laser beams are emitted from the laser array, and accordingly increase in the size and cost of the system becomes serious.

SUMMARY OF THE INVENTION

In view of the foregoing observations and description, the primary object of the present invention is to provide a light amount monitoring system which can monitor the amount of light emitted from a surface emitting laser without substantially increasing the size and cost of a system in which the laser is employed.

In accordance with one aspect of the present invention, there is provided a system for monitoring the amount of light emitted from a surface emitting laser comprising a beam splitter which is fixed to the surface emitting laser and splits a part of a laser beam emitted from the laser as a monitor light, and a photodetector which detects the monitor light.

In accordance with another aspect of the present invention, there is provided a system for monitoring the amount of light emitted from a surface emitting laser comprising a cover glass which is fixed to a casing of the surface emitting laser and splits a part of a laser beam emitted from the laser as a monitor light, and a photodetector which detects the monitor light.

When the surface emitting laser is in the form of a laser array having a plurality of light emitting points, a single photodetector may be used or a plurality of photodetectors equal to the light emitting points in number may be used.

In the former case, a means for controlling the laser array so that a plurality of laser beams are emitted from the respective light emitting points in sequence is employed and the output of the photodetector is sampled in synchronization with switching of the light emitting points, whereby the amounts light of the respective laser beams can be separately detected. In the latter case, each photodetector receives the split part of one of the laser beams.

When a beam splitter or a cover glass integrated with a surface emitting laser is used as the means for splitting the monitor, the size of the system in which the laser is employed is not so increased as compared with when the beam splitter is inserted into the optical system. Further alignment of the beam splitter or the cover glass with the other optical parts is facilitated and the cost of the system is not greatly increased.

DESCRIPTION OF THE PREFERRED EMBODIMENT

Figure 6:
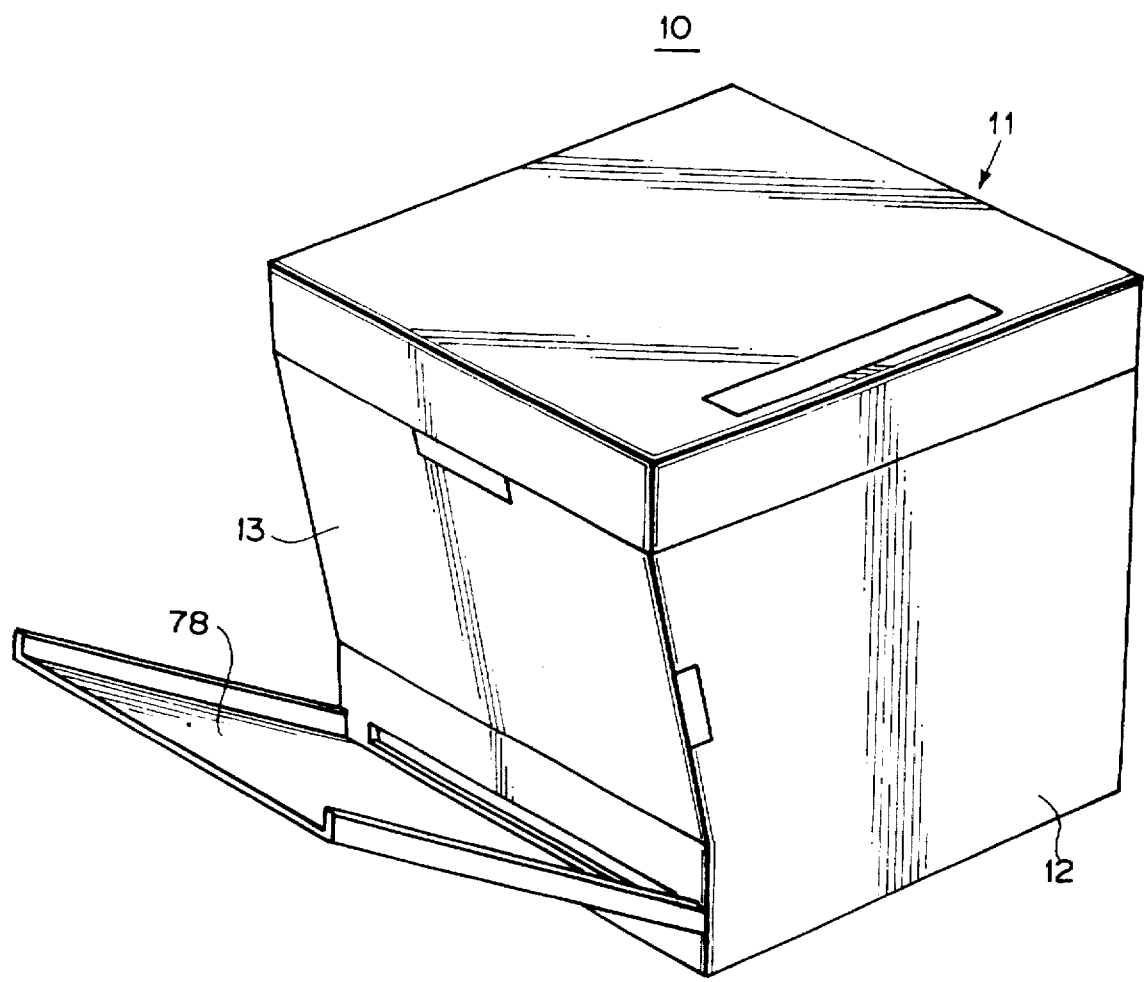
FIG. 6 is a perspective view showing the appearance of the light beam scanning recording device.

As shown in FIG. 6, a light beam scanning recording device 10 has a box-like housing 11 provided with a front door 12 and a side door 13. When the doors 12 and 13 are opened, the structure in the housing 11 is exposed.

Figure 5:
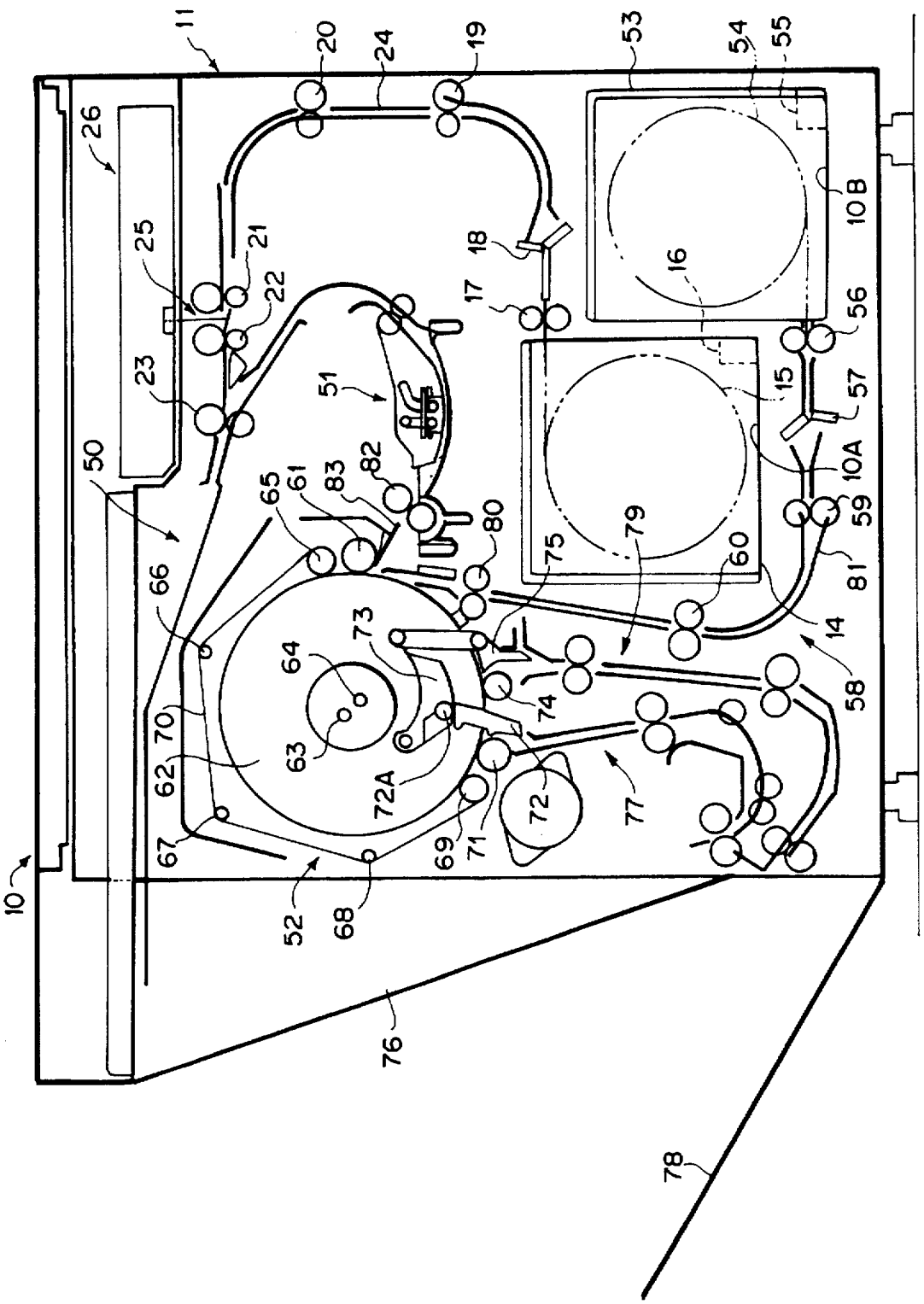
FIG. 5 is a front view of the light beam scanning recording device.

As shown in FIG. 5, a photosensitive material magazine 14 is loaded in the housing 11. A roll of a photosensitive material 15 is contained in the photosensitive material magazine 14. The photosensitive material 15 is drawn out from the magazine 14 at an upper part thereof with its photosensitive surface faced downward.

The magazine 14 is provided with a mark such as bar codes, a notch, a projection or the like according to the kind and/or lot of the photosensitive material 15 contained therein, and a photosensitive material sensor 16 provided in a magazine chamber 10A detects the mark. The photosensitive material sensor 16 is connected to a general control unit which controls the overall light beam scanning recording device 10 and the general control unit determines whether a photosensitive material magazine 14 has been loaded and the kind and the lot of the photosensitive material 15 contained in the magazine 14 on the basis of signals from the sensor 16.

A pair of nip rollers 17 and a cutter 18 are disposed near the exit slit of the magazine 14 and the photosensitive material 15 is drawn out from the magazine 14 by the nip rollers 17 and cut in a predetermined length by the cutter 18. A plurality of conveyor rollers 19 to 23 and a guide plate 24 are provided to convey the photosensitive material 15 cut in the predetermined length to an exposure station 25. The exposure station 25 is between the conveyor rollers 21 and 22 which serve as a sub-scanning means and the photosensitive material 15 is exposed to light when passing through the exposure station 25.

Figure 1:
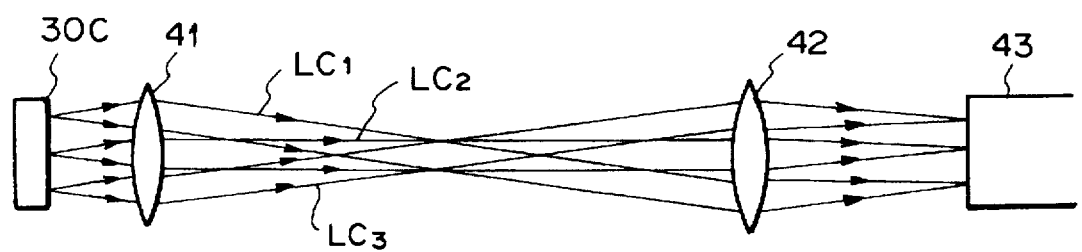
FIG. 1 is a side view showing an important part of the laser scanning unit in a light beam scanning recording device provided with a monitoring system in accordance with a first embodiment of the present invention.
Figure 2:
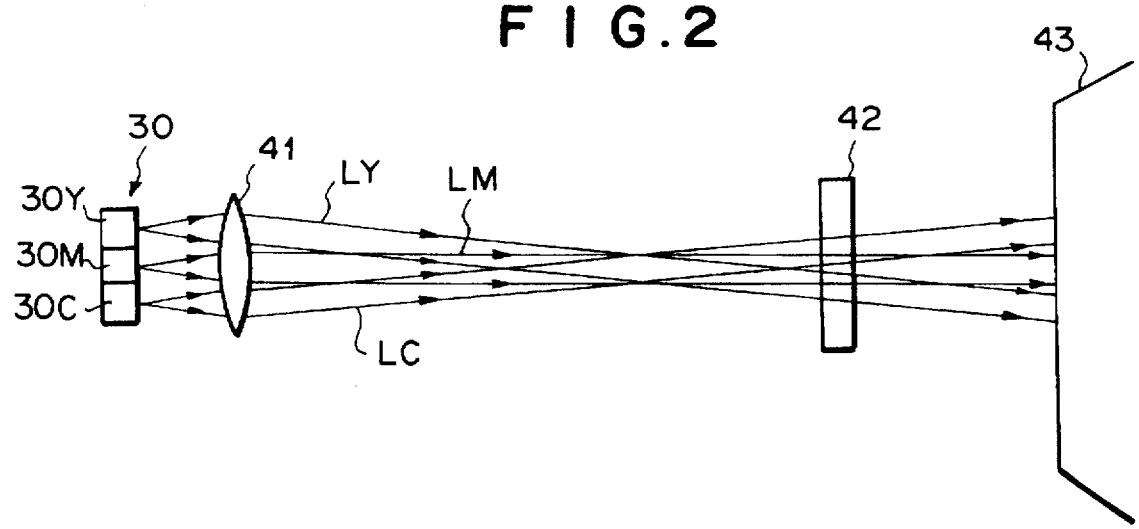
FIG. 2 is a plan view of the important part of the laser scanning unit.
Figure 3:
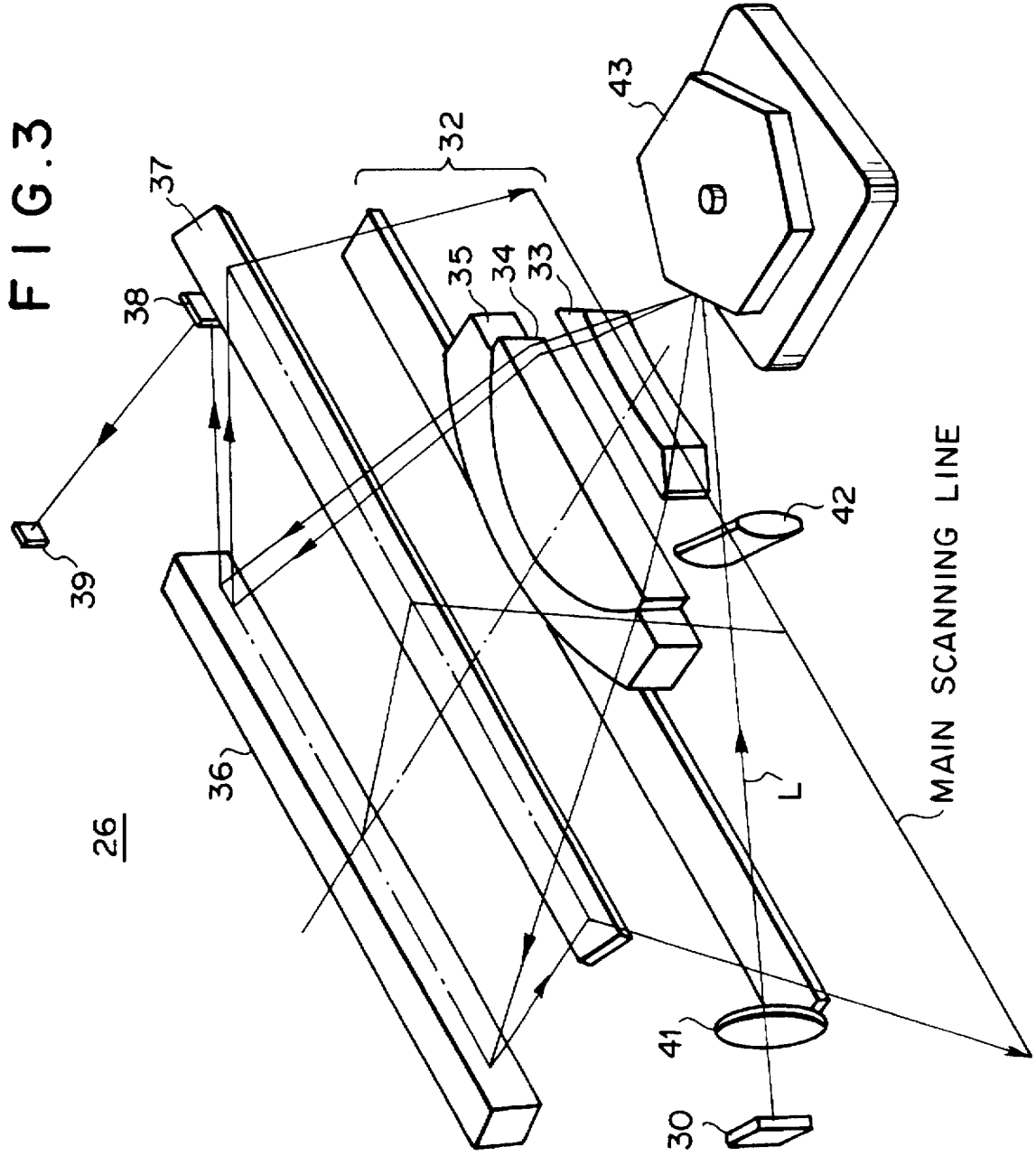
FIG. 3 is a perspective view of the laser scanning unit.
Figure 4:
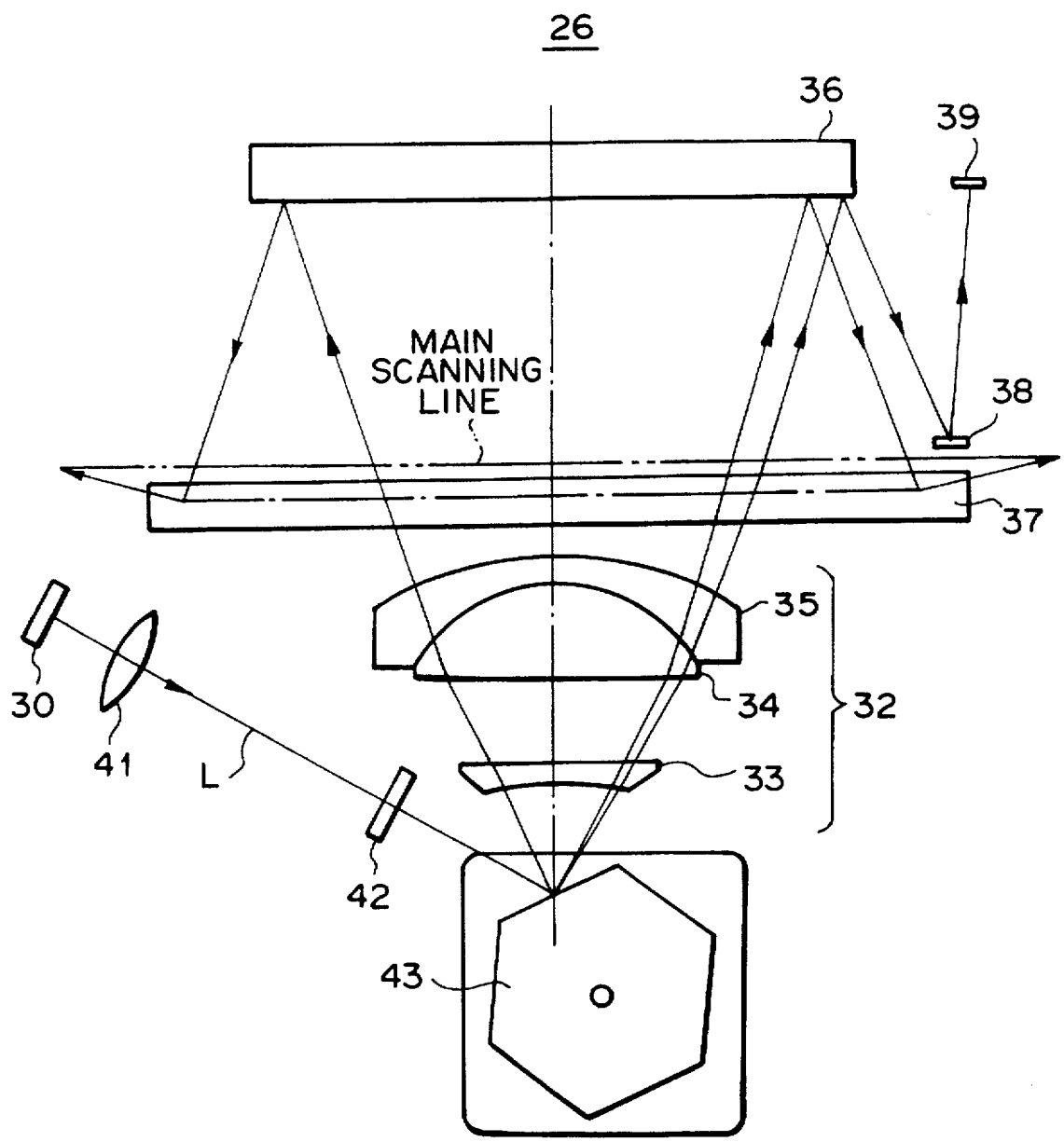
FIG. 4 is a plan view of the laser scanning unit.

A laser scanning unit 26 is disposed just above the exposure station 25. As shown in FIGS. 3 and 4, the laser scanning unit 26 has a light source 30 in the form of a two-dimensional laser array. Though the light source 30 emits a plurality of laser beams as will be described later, only a single laser beam L is shown in FIGS. 3 and 4 for the purpose of simplicity. The basic light beam scanning will be described on the laser beam L by way of example, hereinbelow.

A diverging laser beam L emitted from the light source 30 is collimated by a collimator lens 41 and condensed to converge only in a plane perpendicular to the surface of the paper on which FIG. 4 is drawn by a cylindrical lens 42. The laser beam L thus condensed impinges upon a polygonal mirror 43 to form a linear image on a deflecting surface of the polygonal mirror 43 and then deflected by the polygonal mirror 43, which is rotated, to enter an imaging optical system 32.

The imaging optical system 32 is an fθ lens comprising a concavo-plane lens 33, a plano-convex lens 34 and a concavo-convex lens 35. The laser beam L passing through the imaging optical system 32 is reflected by mirrors 36 and 37 to travel downward and is converged on the upper surface of the photosensitive material 15. The laser beam L scans the upper surface of the photosensitive material 15 in a main scanning direction perpendicular to the direction in which the photosensitive material 15 is conveyed (sub-scanning direction), that is, left and right in FIG. 4. The laser beam L is condensed by the imaging optical system 32 to converge on the surface of the photosensitive material 15 irrespective of the position on the main scanning line.

Figure 8:
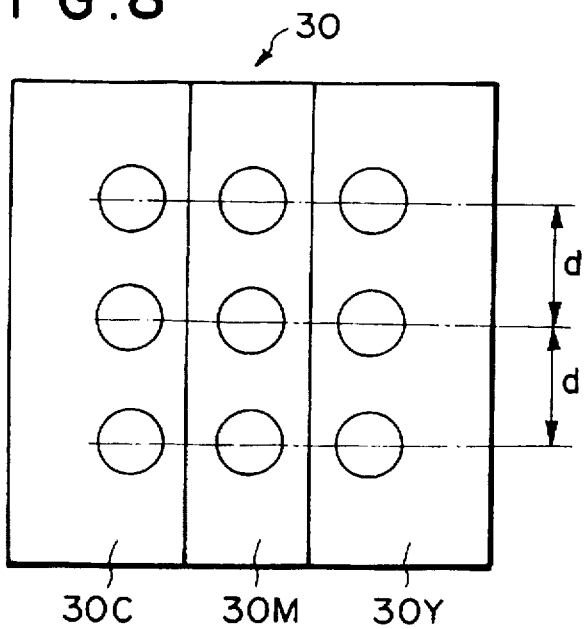
FIG. 8 is a front view of the light source employed in the light beam scanning recording device.

As shown in FIG. 8, the light source 30 comprises a surface emitting laser diode array 30C which emit laser beams LC of, for instance, 750 nm for developing cyan, a surface emitting laser diode array 30M which emit laser beams LM of, for instance, 680 nm for developing magenta, and a surface emitting laser diode array 30Y which emit laser beams LY of, for instance, 810 nm for developing yellow which are combined together to form a two-dimensional array.

Figure 9:
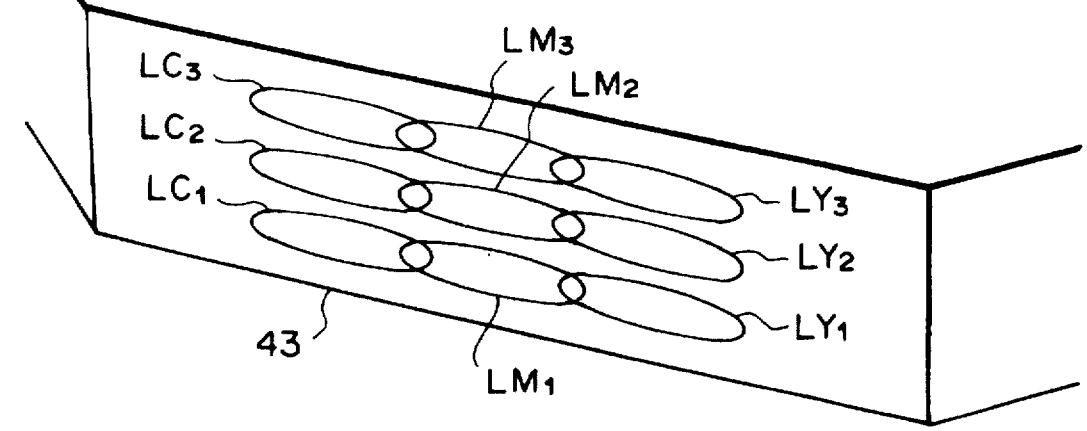
FIG. 9 is a schematic view for illustrating travel of the light beams in the light beam scanning recording device.

Each of the laser diode arrays 30C, 30M and 30Y comprises, for instance, three surface emitting laser diodes linearly arranged at predetermined pitches in the vertical direction in FIG. 8. Laser beams LC1, LC2 and LC3 emitted from the laser diode array 30C, laser beams LM1, LM2 and LM3 emitted from the laser diode array 30M and laser beams LY1, LY2 and LY3 emitted from the laser diode array 30Y impinge upon the deflecting surface of the polygonal mirror 43 in the state shown in FIG. 9. That is, the laser beams LC1, LM1 and LY1 (LC2, LM2 and LY2, LC3, LM3 and LY3) of different wavelengths are positioned side by side in the direction of rotation of the polygonal mirror 43 while the laser beams LC1, LC2 and LC3 (LM1, LM2 and LM3, LY1, LY2 and LY3) of the same wavelengths are positioned side by side in a direction parallel to the rotational axis of the polygonal mirror 43.

Accordingly, the photosensitive material 15 is scanned along three main scanning lines per one main scanning period each by three laser beams (LC1, LM1 and LY1) or (LC2, LM2 and LY2) or (LC3, LM3 and LY3) of different wavelengths. Each set of the laser beams LC, LM and LY may be converged on three points positioned side by side along one main scanning line or on one point.

Figure 10:
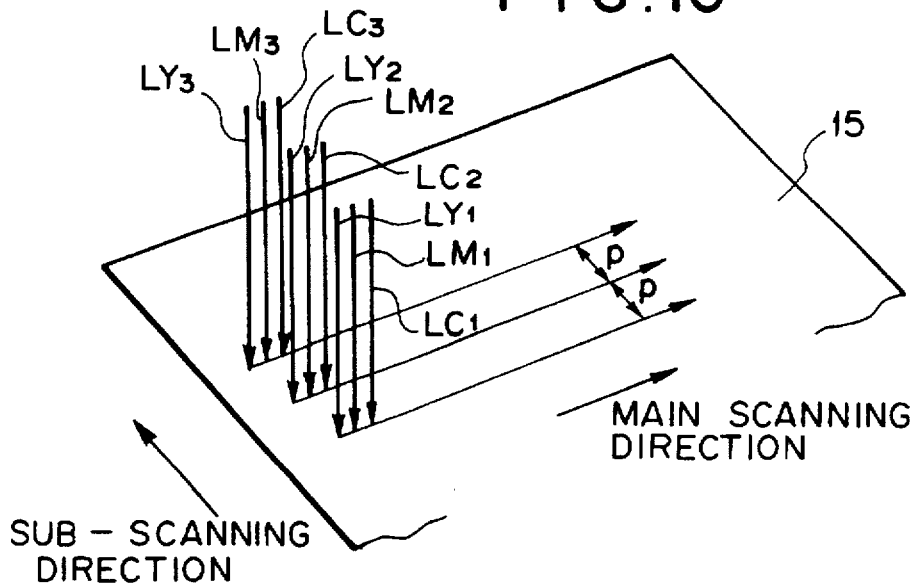
FIG. 10 is a schematic view for illustrating simultaneous recording along a plurality of main scanning lines in the light beam scanning recording device.

The magnification x in the sub-scanning direction by the collimator lens 41, the cylindrical lens 42 and the imaging optical system 32 may be set to satisfy formula $x=p/d$ wherein d represents the pitch between the laser diodes in each of the laser diode arrays 30C, 30M and 30Y (FIG. 8) and p represents desired spaces between the main scanning lines (FIG. 10).

The laser beams LC, LM and LY running out of an effective main scanning region are reflected by a mirror 38 to impinge upon a starting point sensor 39, which may be a photodiode, as shown in FIGS. 3 and 4. Signals output from the starting point sensor 39 upon detection of the laser beams LC, LM and LY are used to time the main scanning and the sub-scanning.

Figure 7:
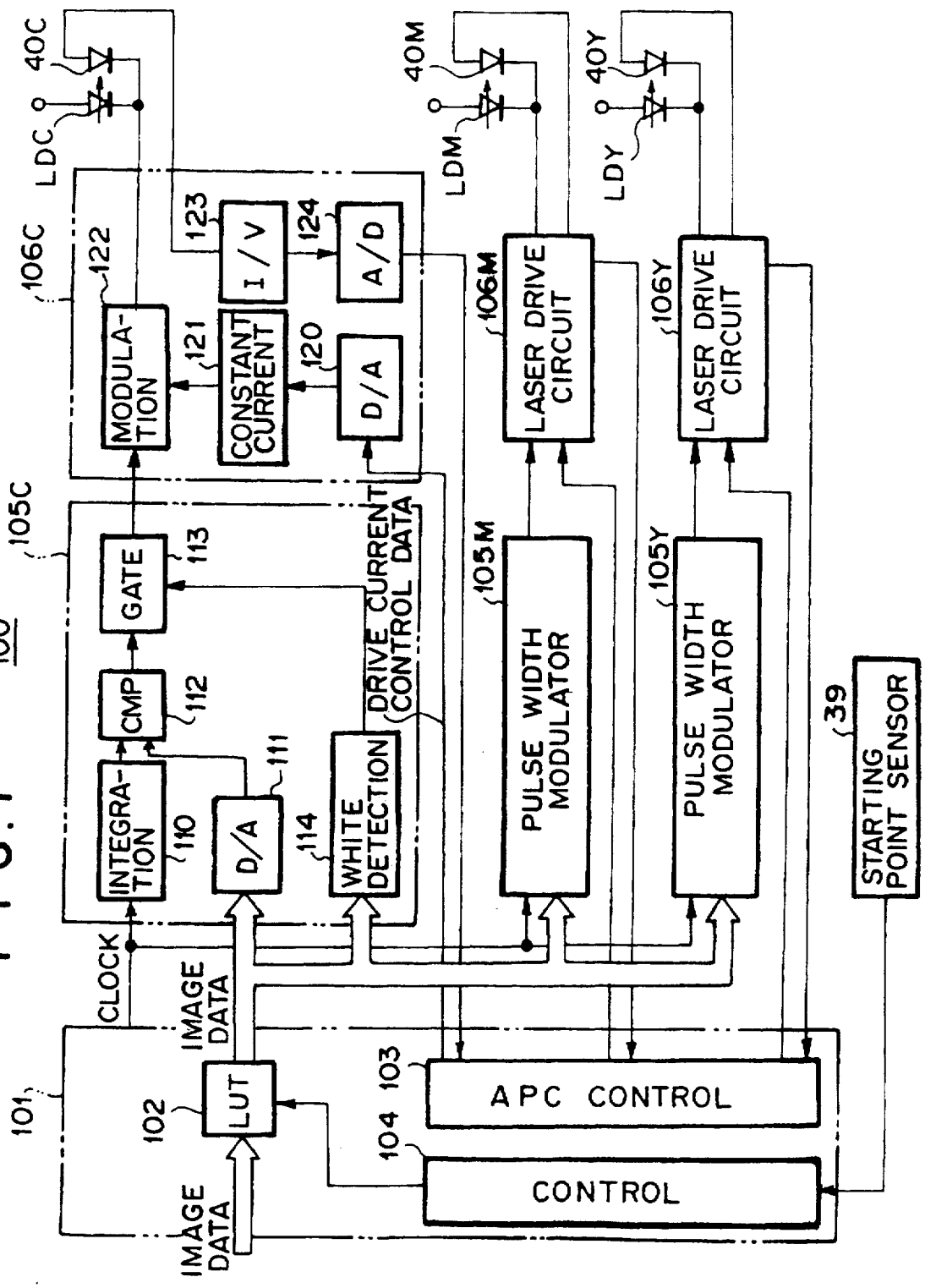
FIG. 7 is a block diagram showing the electric circuit of the light beam scanning recording device.

A control unit 100 which controls the surface emitting laser diode arrays 30C, 30M and 30Y will be described with reference to FIG. 7, hereinbelow. The control unit 100 has a main control section 101 comprising a microcomputer, memories and the like. The main control section 101 functionally comprises a lookup table (LUT) 102 which converts, for instance, 8-bit image data input thereinto into 12-bit image data for recording, an automatic power control (APC) section 103 for effecting automatic power control to be described later and a control section 104 which controls actions of the lookup table 102 and the automatic power control section 103.

Pulse width modulators 105C, 105M and 105Y which are 3 in number, respectively, are connected to the main control section 101. Each of the pulse width modulators 105C is connected to one of the laser diodes LDC in the laser diode array 30C by way of a laser drive circuit 106C, each of the pulse width modulators 105M is connected to one of the laser diodes LDM in the laser diode array 30M by way of a laser drive circuit 106M, and each of the pulse width modulators 105Y is connected to one of the laser diodes LDY in the laser diode array 30Y by way of a laser drive circuit 106Y. In FIG. 7, only one of the pulse width modulators 105C, 105M and 106Y and one of the laser drive circuits 106C, 106M and 106Y are shown.

The pulse width modulator 105C has an integrator 110 and a D/A convertor 111. Clock signals output from the main control section 101 picture element by picture element are input into the integrator 110 and 12-bit image data output from the lookup table 102 are input into the D/A convertor 111. The output end of the integrator 110 is connected to one of a pair of input ends of a comparator (CMP) 112, and triangular signals obtained by integrating the clock signals are input into the comparator 112 from the integrator 110. The output end of the D/A convertor 111 is connected to the other input end of the comparator 112 and an analog signal corresponding to the image data is input into the comparator 112 from the D/A convertor 111.

The comparator 112 compares the levels of the two signals input thereinto with each other and outputs a high level signal when the level of the signal from the integrator 110 exceeds the level of the signal from the D/A convertor 111. The output end of the comparator 112 is connected to a gate circuit 113 and the output end of the gate circuit 113 is connected to the laser drive circuit 106C. Accordingly signals whose pulse width is modulated according to the value of the image data for each picture element, i.e., the image density are input into the laser drive circuit 106C through the gate circuit 113.

The lookup table 102 outputs three pieces of 12-bit image data corresponding to input image data of the respective colors. The three pieces of image data representing the density of cyan are input into three pulse width modulators 105C in sequence at predetermined timings. That is, when image data for a (3i+1)-th main scanning line (i standing for 0, 1, 2, 3 ... ) as numbered in the sub-scanning direction is input into first one of the three pulse width modulators 105C, image data for a (3i+2)-th main scanning line and a (3i+3)-th main scanning line are input into second and third of the three pulse width modulators 105C. This is the same with image data representing the density of magenta and the pulse width modulators 105M and with image data representing the density of yellow and the pulse width modulators 105Y.

Each of the pulse width modulators 105C is provided with a white detecting circuit 114 and the image data from the lookup table 102 is also input into the white detecting circuit 114. The white detecting circuit 114 detects image data corresponding to white in the input image data and outputs a signal which causes the gate of the gate circuit 113 to close during a period the image data corresponding to white is output from the comparator 112, whereby the pulse signal output from the gate circuit 113 is turned low during the period and the pulse corresponding to white is removed.

Since the pulse width modulators 105M and 105Y are the same as the pulse width modulator 105C in structure, they will not be described here.

The laser drive circuit 106C is provided with a D/A convertor 120. The D/A convertor 120 is connected to the automatic power control section 103 in the main control section 101, and digital drive current control data representing the level of the drive current for the surface emitting laser diode array 30C is input into the D/A convertor 120 from the automatic power control section 103. The D/A convertor 120 converts the input drive current control data into an analog signal and inputs it into a constant-current circuit 121. The constant-current circuit 121 outputs drive current at a constant level according to the level of the input analog signal.

The drive current output from the constant-current circuit 121 is input into a modulator 122. The modulator 122 is connected to the pulse width modulator 105C and the surface emitting laser diode array 30C. The modulator 122 changes the value of the drive current according to the width of the pulse signal input from the pulse width modulator 105C and supplies the thus modulated drive current to the laser diode array 30C.

Photodetectors 40C (e.g., photodiodes) for detecting the intensities of the laser beams LC emitted from the respective laser diodes LDC in the laser diode array 30C are provided integrally with the corresponding laser diodes LDC. The output current of the photodetector 40C is input into a current-voltage convertor 123 in the laser drive circuit 106C. The current-voltage convertor 123 converts an input current signal into a voltage signal and inputs it into an A/D convertor 124. The A/D convertor 124 converts the input analog voltage signal into a digital signal and inputs it into the automatic power control section 103.

Figure 11:
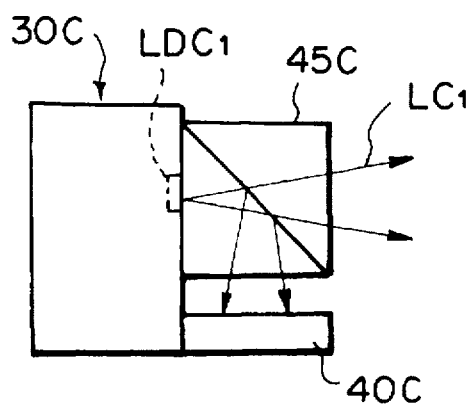
FIG. 11 is a plan view of the monitoring system in accordance with the first embodiment of the present invention.
Figure 12:
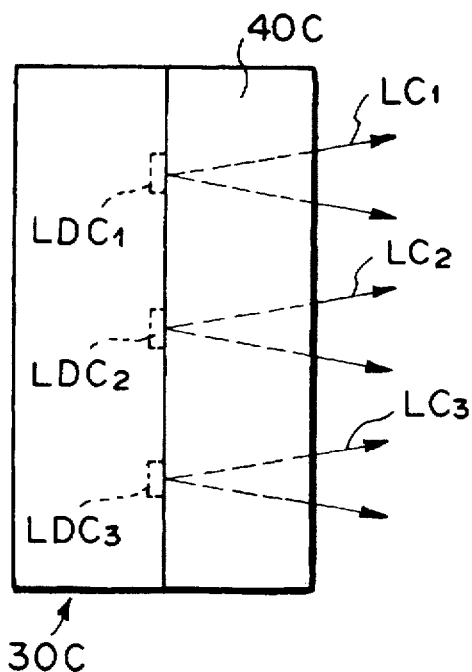
FIG. 12 is a side view of the monitoring system.

A monitoring system in accordance with first embodiment of the present invention will be described with reference to FIGS. 11 and 12, hereinbelow. FIGS. 11 and 12 are a plan view and a side view showing only the surface emitting laser diode array 30C out of the light source 30. As shown in FIGS. 11 and 12, A beam splitter 45C which splits downward a part of laser beams LC1, LC2 and LC3 emitted respectively from the laser diodes LDC1, LDC2 and LDC3 as monitor lights is fixed to the surface emitting laser diode array 30C. The aforesaid photodetector 40C has a relatively large light receiving portion so that it can receive all the monitor lights and is fixed to the laser diode array 30C.

The laser drive circuits 106M and 106Y are the same as the laser drive circuit 106C in structure and accordingly will not be described here. The laser diodes LDM and LDY in the laser diode arrays 30M and 30Y are respectively provided with photodetectors 40M and 40Y the same as the photodetector 40C described above and the output currents of the photodetectors 40M and 40Y are respectively input into the laser drive circuits 106M and 106Y.

As shown in FIG. 5, a switchback section 50 is provided beside the exposure station 25 and a water application section 51 is provided below the exposure station 25. The photosensitive material 15 conveyed to the exposure station 25 from the magazine 14 and exposed to light there is once conveyed into the switchback section 50 and then conveyed to the water application section 51 by reverse of the conveyor rollers 23. Water is supplied to the water application station 51 through a plurality of pipes. The photosensitive material 15 applied with water is conveyed to a heat development/transfer section 52 disposed beside the water application section 51.

A roll of an image receiving material 54 is contained in an image receiving material magazine 53 disposed beside the photosensitive material magazine 14 in the housing 11. The image forming surface of the image receiving material 54 is applied with dye fixing agent containing therein mordant. The image receiving material 54 is drawn out from the magazine 53 at a lower part thereof with its image receiving surface faced upward.

The image receiving material magazine 53 as well as the photosensitive material magazine 14 comprises a body portion and a pair of side frames fixed to the body portion at opposite ends of the body portion and can be taken out from the housing 11 by pulling forward of the housing 11 (in the direction of width of the roll of the image receiving material 54).

The magazine 53 is provided with a mark such as bar codes, a notch, a projection or the like according to the kind and/or lot of the image receiving material 54 contained therein, and an image receiving material sensor 55 provided in a magazine chamber 10B detects the mark. The image receiving material sensor 55 is connected to the aforesaid general control unit and the general control unit determines whether an image receiving material magazine 53 has been loaded and the kind and the lot of the image receiving material 54 contained in the magazine 53 on the basis of signals from the sensor 55.

A pair of nip rollers 56 and a cutter 57 are disposed near the exit slit of the magazine 53 and the image receiving material 54 is drawn out from the magazine 53 by the nip rollers 56 and cut in a predetermined length by the cutter 57. An image receiving material conveyor 58 comprising a plurality of conveyor rollers 59, 60 and 80 and a guide plate 81 is provided to convey the image receiving material 54 cut in the predetermined length to the heat development/transfer section 52.

The photosensitive material 15 conveyed to the heat development/transfer section 52 is fed between a laminating roller 61 and a heating drum 62. The image receiving material 54 is conveyed in synchronization with conveyance of the photosensitive material 15 with the leading end of the image receiving material 54 behind the leading end of the photosensitive material 15 by a predetermined length and fed between the laminating roller 61 and the heating drum 62, whereby the image receiving material 54 is superimposed on the photosensitive material 15.

A pair of halogen lamps 63 and 64 are disposed inside the heating drum 62 to heat the outer surface of the heating drum 62. Five rollers 65 to 69 are disposed around the heating drum 62 and an endless pressure belt 70 is passed around the rollers 65 to 69. The pressure belt 70 is pressed against the outer peripheral surface of the heating drum 62.

A flexible guide roller 71 and a stripper claw 72 are disposed in this order in the conveying direction of the pressure belt 70 near the heating drum 62 on the downstream side. The stripper claw 72 is supported to be swung about a pivot pin 72A and is driven by a cam 73. A photosensitive material discarding system 77 comprising known rollers and guide plates is disposed below the stripper claw 72 and conveys the photosensitive material 15 stripped off the heating drum 62 to a discarding box 76.

A stripper roller 74 and a stripper claw 75 for stripping the image receiving material 54 off the heating drum 62 are disposed beside the flexible roller 71 in this order in the conveying direction. An image receiving material conveyor system 79 comprising known rollers and guide plates is disposed below the stripper roller 74 and the stripper claw 75 and conveys the image receiving material 54 stripped off the heating drum 62 to a tray 78.

The operation of the light beam scanning recording system 10 of this embodiment will be described hereinbelow. Before recording an image, a color alignment correction is effected. That is, when the laser diode arrays 30C, 30M and 30Y are simultaneously operated, the beam spots of the laser beams LC, LM and LY on the photosensitive material 15 cannot be correctly aligned with each other in the main scanning direction due to difference in the optical paths of the laser beams LC, LM and LY. The color alignment correction is for causing the beam spots of the laser beams LC, LM and LY on the photosensitive material 15 to correctly coincide with each other. That is, the laser diode arrays 30C, 30M and 30Y are operated in sequence at predetermined intervals. This is effected by shifting the phases of the clock signals input into the respective pulse width modulators 105C, 105M and 105Y from each other according to shift in time between the detecting signals of the laser beams LC, LM and LY input into the control section 104 from the starting point sensor 39.

Detailed method of the color alignment correction is disclosed in Japanese Unexamined Patent Publication No.7 (1995)-5591.

When recording start instruction is input into the general control unit, the nip rollers 17 are operated to draw out the photosensitive material 15 from the magazine 14 and then the cutter 18 is operated to cut the photosensitive material 15 in a predetermined length.

The photosensitive material 15 cut in the predetermined length is fed into the exposure station 25 by the conveyor rollers 19 and the like with its photosensitive surface faced upward. Then the laser scanning unit 26 is operated in synchronization with the conveyor rollers 21 and 22 which double as a sub-scanning means and the photosensitive material 15 is exposed to laser beams emitted from the laser scanning unit 26. Exposure of the photosensitive material 15 to the laser beams will be described in detail with reference to FIGS. 3, 4 and 7, hereinbelow.

When the starting point sensor 39 detects the laser beams LC, LM and LY and the output signals of the starting point sensor 39 are input into the automatic power control section 103, an automatic power control is performed. The automatic power control is for controlling the drive current for each of the laser diodes in the laser diode arrays 30C, 30M and 30Y so that a predetermined output is obtained for a given image data. That is, upon receipt of the output signals from the starting point sensor 39, the automatic power control section 103 once turns off the laser diodes in the laser diode arrays 30C, 30M and 30Y and then turns on the laser diodes for a predetermined time, which is short (e.g., 100 μsec), on the basis of a drive current control data representing target values of output powers. The automatic power control section 103 takes outputs of the photodetectors 40C, 40M and 40Y each three in number at the time the laser diodes are turned on and changes the values in the drive current control data so that the output powers of the laser diodes represented by the outputs of the photodetectors 40C, 40M and 40Y converge on the target values.

These steps will be described in more detail on the surface emitting laser diode array 30C shown in FIGS. 11 and 12 by way of example. The automatic power control section 103 drives the laser diodes LDC1, LDC2 and LDC3 of the surface emitting laser diode array 30C to light for a predetermined time in sequence. Then the automatic power control section 103 separately detects the light outputs (the amount of light emitted) of the laser diodes LDC1, LDC2 and LDC3 by sampling the output of the photodetector 40C in synchronization with lighting of the laser diodes LDC1, LDC2 and LDC3, and changes the values in the drive current control data for each laser diodes, whereby a constant light output can be obtained for a given image data even if the three laser diodes LDC1, LDC2 and LDC3 differ from each other in properties.

Since the beam splitter 45C is integrated with the surface emitting laser diode array 30C, the size of the light beam scanning recording system 10 is not so increased as compared with when the beam splitter is inserted into the optical system. Further alignment of the beam splitter 45C and the laser diode array 30C with the other optical parts is facilitated and the cost of the system is not greatly increased.

The other surface emitting laser diode arrays 30M and 30Y are controlled in the same manner so that a constant light output can be obtained for a given image data.

The automatic power control is performed each time the starting point sensor 39 detects the laser beams LC, LM and LY, and three main scanning lines are exposed during intervals. That is, three pieces of recording image data for three main scanning lines are supplied to the pulse width modulators 105C, 105M and 105Y each three in number, and the pulse width modulators 105C, 105M and 105Y generate signals pulse-width-modulated according to image data for each picture element and input the pulse-width-modulated signals to the respective laser drive circuits 106C, 106M and 106Y. The laser drive circuits 106C, 106M and 106Y modulate the laser drive currents according to the input pulse-width-modulated signals and supply them to the laser diodes in the laser diode arrays 30C, 30M and 30Y.

In this manner, the intensities of three sets of the laser beams (LC1, LM1 and LY1), (LC2, LM2 and LY2) and (LC3, LM3 and LY3) are modulated according to the image data for each picture element and since the three sets of the laser beams (LC1, LM1 and LY1), (LC2, LM2 and LY2) and (LC3, LM3 and LY3) thus modulated scan the photosensitive material 15 along three different main scanning lines, recording is effected for three main scanning lines at one time. Further since the photosensitive material 15 is conveyed in the sub-scanning direction in synchronization with the main scanning, the photosensitive material 15 is two-dimensionally exposed to the laser beams LC, LM and LY.

The conveyor rollers 23 shown in FIG. 5 start to rotate in response to start of exposure by the laser scanning unit 26 and once feed the photosensitive material 15 to the switchback portion 50. When recording is ended and the rear end of the photosensitive material 15 is moved away from the conveyor rollers 22, the conveyor rollers 23 are reversed to feed the photosensitive material 15 to the water application section 51.

In the water application station, the photosensitive material 15 is applied with water as a solvent for image forming and then passed through the water application section 51 with excessive water removed by squeeze rollers 82. Then the photosensitive material 15 is fed to the heat development/transfer section 52 by the squeeze rollers 82.

Further the image receiving material 54 is drawn out from the magazine 53 by the nip rollers 56 in response to start of exposure and then cut by the cutter 57 in a predetermined length. The image receiving material 54 is conveyed by the image receiving material conveyor system 58 to a position just short of the heat development/transfer section 52 and waits there.

When it is detected that the photosensitive material 15 is fed between the laminating roller 61 and the heating drum 62 by the squeeze rollers 82, the image receiving material conveyor system 58 resumes conveying the photosensitive material 15 to convey the photosensitive material 15 to the laminating roller 61 and at the same time the heating drum 62 starts to rotate in the counterclockwise direction in FIG. 5.

A guide plate 83 is disposed between the laminating roller 61 and the squeeze rollers 82 to guide the photosensitive material 15 to the laminating roller 61.

The photosensitive material 15 and the image receiving material 54 superimposed by the laminating roller 61 are conveyed over about two thirds of the circumference of the heating drum 62 (from the roller 65 to the roller 69) sandwiched between the heating drum 62 and the pressure belt 70, whereby the photosensitive material 15 and the image receiving material 54 are heated and movable dye is transferred from the photosensitive material 15 to the dye fixing layer on the image receiving material 54 to form a color image.

When the photosensitive material 15 and the image receiving material 54 reach the lower side, the stripper claw 72 is actuated by the cam 73 and engages with the leading end of the photosensitive material 15 which is conveyed forward of the image receiving material 54 to strip the photosensitive material 15 off the heating drum 62. In response to return of the stripper claw 72, a pinch roller (not shown) pushes the photosensitive material 15 and the photosensitive material 15 is passed around the guide roller 71, whereby the photosensitive material 15 is moved downward. Further the photosensitive material 15 is conveyed by the photosensitive material discarding system 77 to the discarding box 76 while dried by a dryer system (not shown).

On the other hand, the image receiving material 54 separated from the photosensitive material 15 and conveyed on the heating drum 62 is stripped off the heating drum 62 by the stripper claw 75 actuated by the cam 73 and is moved downward by the stripper roller 74. Then the image receiving material 54 is conveyed to the tray 78 by the image receiving material conveyor system 79 while dried by a dryer system (not shown).

Figure 13:
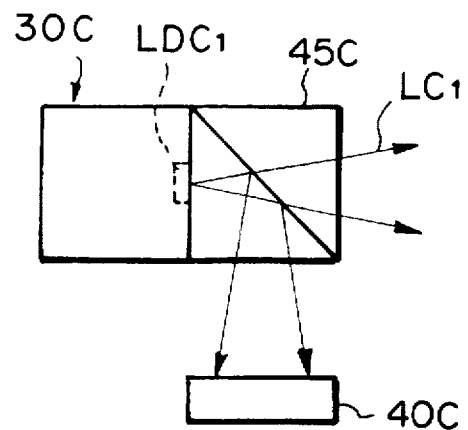
FIG. 13 is a plan view of the monitoring system in accordance with a second embodiment of the present invention.

Though, in the first embodiment described above, the photodetector 40C is fixed to the surface emitting laser diode array 30C for the purpose of integrating the three surface emitting laser diode arrays 30C, 30M and 30Y, the photodetector 40C may be separate from the laser diode arrays 30C as in a second embodiment shown in FIG. 13. Similarly the photodetectors 40M and 40Y may be separate from the laser diode arrays 30M and 30Y.

Figure 14:
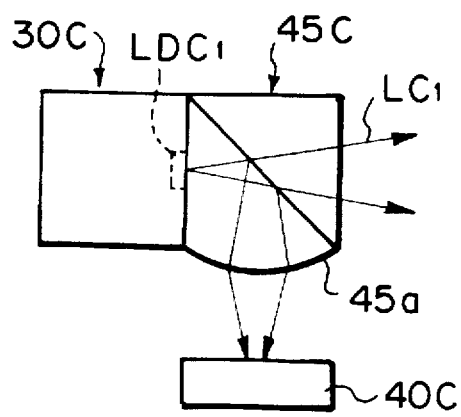
FIG. 14 is a plan view of the monitoring system in accordance with a third embodiment of the present invention.
Figure 15:
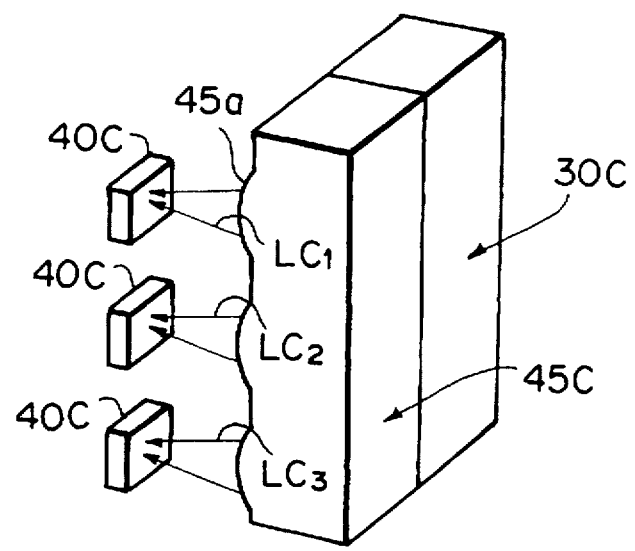
FIG. 15 is a perspective view of the monitoring system in accordance with the third embodiment of the present invention.

The monitor light emanating surface 45a of the beam splitter 45C may be formed like convex lenses as in a third embodiment shown in FIGS. 14 and 15 so that the monitor lights are focused. With this arrangement, the optical paths of the monitor lights cannot intersect with each other even at a substantial distance from the beam splitter 45C, the monitor lights can be separately detected by three discrete photodetectors 40C.

When the monitor lights can be separately detected, the three laser diodes LDC1, LDC2 and LDC3 may be simultaneously driven in the automatic power control and accordingly, means for driving the three laser diodes LDC1, LDC2 and LDC3 in sequence and means for sampling the output of the photodetector in synchronization with drive of the laser diodes become unnecessary.

Figure 16:
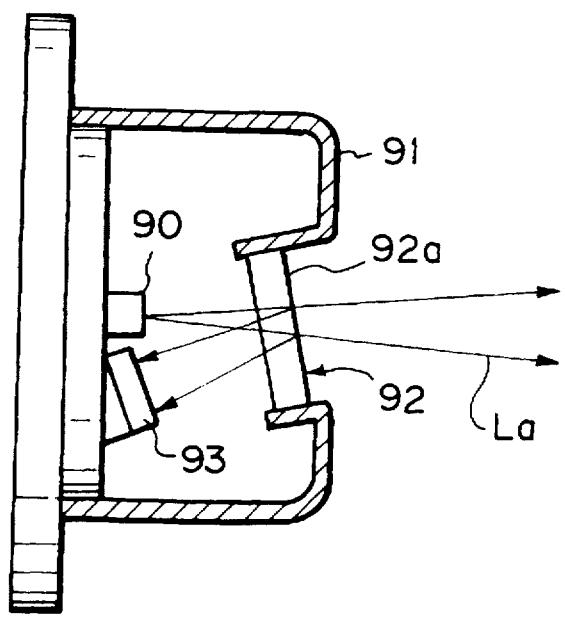
FIG. 16 is a side view of the monitoring system in accordance with a fourth embodiment of the present invention.

Though, in the embodiments described above, the present invention is applied to a surface emitting laser array, the present invention can also be applied to a surface emitting laser having a single light emitting point. A monitoring system in accordance with a fourth embodiment of the present invention shown in FIG. 16 is for such a surface emitting laser. In FIG. 16, the surface emitting laser 90 having a single light emitting point is contained in a casing 91. A cover glass 92 is fitted in the casing 91 so that a laser beam La emitted from the laser 90 travels through the cover glass 92.

A beam splitter film 92a is formed on the cover glass 92 and a part of the laser beam La is reflected at the beam splitter film 92a. The reflected laser beam is detected by a photodetector 93 disposed inside the casing 91 as a monitor light.

Also in this embodiment, since the cover glass 92 is integrated with the surface emitting laser 90, the size of the light beam scanning recording system 10 is not so increased as compared with when the beam splitter is inserted into the optical system. Further alignment of the cover glass 92 and the laser 90 with the other optical parts is facilitated and the cost of the system is not greatly increased.

Though referred to as a cover "glass", the cover glass 92 may be formed of a material other than glass, e.g., synthetic resin.

Further a cover glass may be applied as a beam splitting means to a laser array having a plurality of light emitting points.

What is claimed is:

1. A system for monitoring the amount of light emitted from a surface emitting laser comprising:

a surface emitting laser in the form of a laser array having a plurality of light emitting points;

a beam splitter which splits a part of a laser beam emitted from the laser as a monitor light, a photodetector means which detects the monitor light, said photodetector means comprises a single photodetector which detects all the monitor lights split from the laser beams emitted from the respective light emitting points, and a means for controlling the laser array so that a plurality of laser beams are emitted from the respective light emitting points in sequence.

2. A system for monitoring the amount of light emitted from a surface emitting laser as defined in claim 1 in which said beam splitter is fixed to the surface emitting laser.

3. A system for monitoring the amount of light emitted from a surface emitting laser as defined in claim 1 in which said beam splitter is formed on a cover glass which is fixed to a casing of the surface emitting laser.

4. A system for monitoring the amount of light emitted from a surface emitting laser as defined in claim 1 in which said photodetector means is attached to said surface emitting laser.

5. A system for monitoring the amount of light emitted from a surface emitting laser as defined in claim 1 wherein said photodetector means is separated from said surface emitting laser.

6. A system for monitoring the amount of light emitted from a surface emitting laser as defined in claim 1 wherein said beam splitter is formed as a convex lens which focuses said monitor light on said photodetector means.

7. A system for monitoring the amount of light emitted from a surface emitting laser as defined in claim 1 wherein said control means provides a modulated drive current to said surface emitting laser.

8. A system for monitoring the amount of light emitted from a surface emitting laser as defined in claim 7 wherein said control unit further comprises an automatic power control circuit for regulating the power supplied to said surface emitting laser.

9. A system for monitoring the amount of light emitted from a surface emitting laser comprising:

a beam splitter which is fixed to the surface emitting laser and splits a part of a laser beam emitted from the laser as a monitor light, a photodetector means which detects the monitor light and converts the monitor light into an electric signal; and a control means which compares said electric signal with a predetermined target value to arrive at a proper drive current for said surface emitting laser;

wherein said surface emitting laser is in the form of a laser array having a plurality of light emitting points, and said photodetector means comprises a plurality of photodetectors equal to the light emitting points in number which respectively detect the monitor lights split from the laser beams emitted from the respective light emitting points.

* * * * *